(12) United States Patent
Melikyan et al.

(10) Patent No.: US 10,319,566 B2
(45) Date of Patent: Jun. 11, 2019

(54) APPARATUS FOR SUPPLYING POWER AND APPARATUS FOR TREATING SUBSTRATE INCLUDING THE SAME

(71) Applicant: SEMES CO., LTD., Cheonan-si, Chungcheongnam-do (KR)

(72) Inventors: Harutyun Melikyan, Cheonan-si (KR); Ogsen Galstyan, Cheonan-si (KR); Junghwan Lee, Ansan-si (KR); Jong Hwan An, Yongin-si (KR); Shin-Woo Nam, Yongin-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 15/962,487

(22) Filed: Apr. 25, 2018

(65) Prior Publication Data

US 2018/0315580 A1 Nov. 1, 2018

(30) Foreign Application Priority Data

Apr. 26, 2017 (KR) .......................... 10-2017-0053832

(51) Int. Cl.
*H01J 37/32* (2006.01)
*H03H 7/40* (2006.01)

(52) U.S. Cl.
CPC ...... *H01J 37/32174* (2013.01); *H01J 37/321* (2013.01); *H03H 7/40* (2013.01)

(58) Field of Classification Search
CPC .............................. H01J 37/32174; H03H 7/40

USPC .................................................... 315/111.51
See application file for complete search history.

(56) References Cited

U.S. PATENT DOCUMENTS

| 6,507,155 | B1 | 1/2003 | Barnes et al. |
| 6,617,794 | B2 | 9/2003 | Barnes et al. |
| 9,059,678 | B2 * | 6/2015 | Long .......................... H03H 7/40 |
| 2010/0243162 | A1 * | 9/2010 | Koshimizu ........ H01J 37/32091 156/345.28 |
| 2010/0267247 | A1 * | 10/2010 | Ma .......................... H01J 37/321 438/765 |
| 2016/0027617 | A1 * | 1/2016 | Son ........................ H01J 37/321 156/345.28 |
| 2017/0071053 | A1 * | 3/2017 | Lee ............................ H05H 1/46 |

* cited by examiner

*Primary Examiner* — Daniel D Chang
(74) *Attorney, Agent, or Firm* — Harness, Dickey & Pierce, P.L.C.

(57) ABSTRACT

Disclosed inventions are apparatus for supplying power and an apparatus for treating a substrate including the same. The apparatus for supplying power includes a high-frequency power source that provides a high-frequency power; a plasma source including first and second antennas that generates plasma by using the high-frequency power; and a power divider connected between the high-frequency power source and the plasma source to divide the high-frequency power supplied to the first and second antennas. The power divider includes a first variable device that controls the high-frequency power supplied to the first and second antennas; and a second variable device that compensates for non-linearity of the high-frequency power supplied to the first and second antennas.

12 Claims, 6 Drawing Sheets

APPARATUS FOR SUPPLYING POWER AND APPARATUS FOR TREATING SUBSTRATE INCLUDING THE SAME

CROSS-REFERENCE TO RELATED APPLICATIONS

This application claims priority under 35 U.S.C. § 119 to Korean Patent Application No. 10-2017-0053832 filed on Apr. 26, 2017, in the Korean Intellectual Property Office, the disclosures of which are incorporated by reference herein in their entireties.

BACKGROUND

Embodiments of the inventive concept described herein relate to an apparatus for supplying power and an apparatus for treating a substrate including the same, and more particularly, relate to efficient control of a ratio of power supplied to each plasma source in an apparatus of treating a substrate using a plurality of plasma sources.

A process of manufacturing a semiconductor may include a substrate treating process using plasma. For example, a chamber may be used to produce plasma for an etching or ashing process during the process of manufacturing a semiconductor, where a substrate may be etched or ashed by using the plasma.

Recently, as the size of a substrate to be processed using plasma is increased, plasma processing apparatuses have been used to process large-area substrates. However, such plasma processing apparatuses have deteriorated uniformity of plasma. To compensate for it, a method of controlling the density of plasma in the chamber by using a plurality of plasma sources has been developed, and the density of plasma is adjusted by controlling a ratio of power supplied to the plurality of plasma sources.

To control the ratio of power, a method using a variable capacitor has been used. However, since the power ratio by the variable capacitor value exhibits non-linearity, it is difficult to precisely control the power ratio and TTTM (Tool to Tool Matching).

SUMMARY

Embodiments of the inventive concept provide easy control of a power ratio when power is supplied to a plurality of plasma sources.

Objects of the present invention may not be limited to the above, and other objects will be clearly understandable to those having ordinary skill in the art from the inventive concept provided below together with accompanying drawings.

According to an exemplary embodiment, an apparatus for supplying power includes a high-frequency power source that provides a high-frequency power, a plasma source including first and second antennas that generates plasma by using the high-frequency power, and a power divider connected between the high-frequency power source and the plasma source to divide the high-frequency power supplied to the first and second antennas, wherein the power divider includes a first variable device that controls the high-frequency power supplied to the first and second antennas, and a second variable device that compensates for non-linearity of the high-frequency power supplied to the first and second antennas.

The first and second variable devices may be variable capacitors.

The apparatus may further include an impedance matching unit connected between the high-frequency power source and the power divider to perform impedance matching.

The first and second variable devices of the power divider may be provided between the impedance matching unit and the plasma source in a symmetrical structure.

The power divider may further include a pair of reactance devices connected between the first and second variable devices, and the pair of reactance devices may be provided to be symmetrical to each other with respect to the impedance matching unit.

The first and second variable devices of the power divider may be provided between the impedance matching unit and the plasma source in an asymmetrical structure.

The power divider may further include a reactance device connected between the first and second variable devices.

According to an exemplary embodiment, an apparatus for treating a substrate includes a chamber having a space for processing the substrate therein, a substrate support assembly placed in the chamber to support the substrate; a gas supply unit that supplies a gas into the chamber, and a power supply unit that supplies a high-frequency power such that the gas in the chamber is excited into a plasma state, wherein the power supply unit includes a high-frequency power source that provides a high-frequency power, a plasma source including first and second antennas that generates plasma by using the high-frequency power, and a power divider connected between the high-frequency power source and the plasma source to divide the high-frequency power supplied to the first and second antennas, wherein the power divider includes a first variable device that controls the high-frequency power supplied to the first and second antennas; and a second variable device that compensates for non-linearity of the high-frequency power supplied to the first and second antennas.

The first and second variable devices may be variable capacitors.

The power supply unit may further include an impedance matching unit connected between the high-frequency power source and the power divider to perform impedance matching.

The first and second variable devices of the power divider may be provided between the impedance matching unit and the plasma source in a symmetrical structure.

The power divider may further include a pair of reactance devices connected between the first and second variable devices, and the pair of reactance devices may be provided to be symmetrical to each other with respect to the impedance matching unit.

The first and second variable devices of the power divider may be provided between the impedance matching unit and the plasma source in an asymmetrical structure.

The power divider may further include a reactance device connected between the first and second variable devices.

According to the embodiments of the inventive concept, it may be possible to easily control a power ratio when power is provided to a plurality of plasma sources.

Effects of the present concept may not be limited to the above, and other effects of the present concept will be clearly understandable to those having ordinary skill in the art from the present concept provided below together with accompanying drawings.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Advantages and features of embodiments of the inventive concept, and method for achieving thereof will be apparent with reference to the accompanying drawings and detailed description that follows. But, it should be understood that the inventive concept is not limited to the following embodiments and may be embodied in different ways, and that the embodiments are given to provide complete disclosure of the inventive concept and to provide thorough understanding of the inventive concept to those skilled in the art, and the scope of the inventive concept is limited only by the accompanying claims and equivalents thereof.

Even though it is not defined, all terms (including technical or scientific terms) used herein have the same meanings as those belonging to the inventive concept is generally accepted by common techniques in the art. The terms defined in general dictionaries may be construed as having the same meanings as those used in the related art and/or a text of the present application and even when some terms are not clearly defined, they should not be construed as being conceptual or excessively formal.

The terms used in the present specification are provided to describe embodiments, not intended to limit it. Singular forms are intended to include plural forms unless the context clearly indicates otherwise. It will be further understood that the terms "includes," "including," "comprises," and/or "comprising," used herein, specify the presence of stated features, integers, steps, operations, elements, and/or components, but do not preclude the presence or addition of one or more other features, integers, steps, operations, elements, components, and/or groups thereof. In the present disclosure, the term "and/or" indicates each of listed components or various combinations thereof.

An embodiment of the present concept provides an apparatus for supplying power, which is capable of easily controlling a power ratio when power is supplied to a plurality of plasma sources, and an apparatus for treating a substrate including the same. In the prior art, it has problem that it is difficult to precisely control the power supplied to each antenna due to the nonlinearity of power supplied according to a value of a variable device in a power divider using the variable device. In order to solve the problem, an apparatus for supplying power according to an embodiment of the present concept further includes a variable device configured to compensate for the nonlinearity. According to an embodiment, by controlling two variable devices, the linearity of the power supplied to each antenna may be ensured such that precise process control and Tool-to-Tool matching (TTTM) are easily performed.

Hereinafter, embodiments of the present concept will be described in detail with reference to accompanying drawings.

Figure 1:
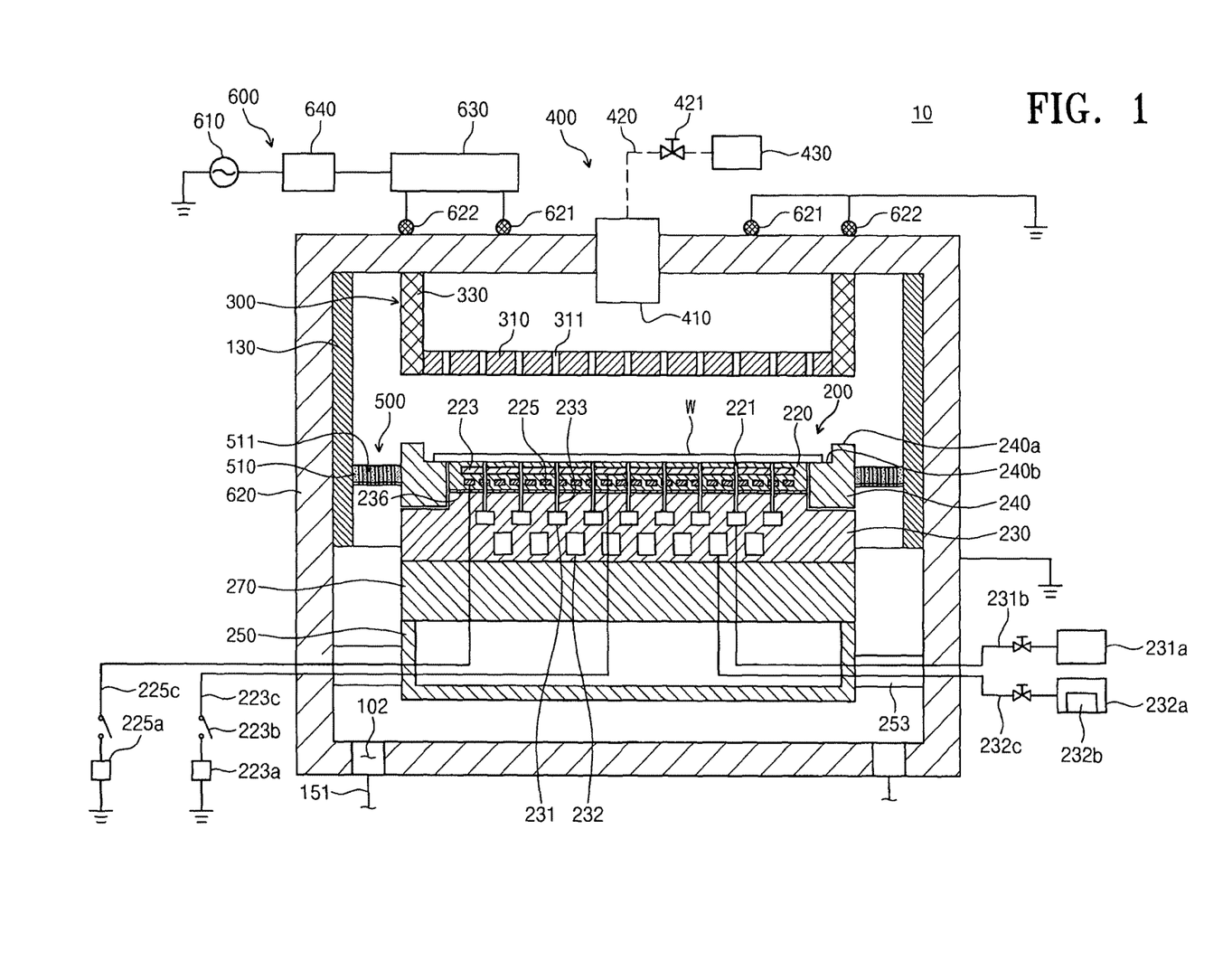
FIG. 1 is an exemplary view illustrating an apparatus for treating a substrate according to an embodiment of the present concept.

FIG. 1 is an exemplary view illustrating an apparatus 10 for treating a substrate according to an embodiment of the present concept.

Referring to FIG. 1, the apparatus 10 for treating a substrate processes a substrate W by using plasma. For example, the apparatus 10 for treating a substrate may perform an etching process on the substrate W. The apparatus 10 for treating a substrate may include a chamber 620, a substrate support assembly 200, a showerhead 300, a gas supply unit 400, a baffle unit, 500, and a power supply unit 600.

The chamber 620 may provide a processing space in which a substrate processing process is performed. The chamber 620 may have a processing space therein and may be provided in a sealed form. The chamber 620 may be formed of a metal material. The chamber 620 may be formed of aluminum. The chamber 620 may be grounded. An exhaust hole 102 may be formed on a bottom surface of the chamber 620. The exhaust hole 102 may be connected to an exhaust line 151. The reaction byproducts generated in the process and the gas staying in the inner space of the chamber may be discharged to an outside through the exhaust line 151. The inside of the chamber 620 may be depressurized to a predetermined pressure by the exhaust process.

According to an embodiment, a liner 130 may be provided in the chamber 620. The liner 130 may have a cylindrical shape with upper and lower surface opened. The liner 130 may be provided to be in contact with an inner surface of the chamber 620. The liner 130 protects an inner wall of the chamber 620 to prevent the inner wall of the chamber 620 from being damaged by an arc discharge. In addition, the impurities generated during a substrate treatment process may be prevented from being deposited on the inner wall of the chamber 620. Optionally, the liner 130 may not be provided.

The substrate support assembly 200 may be placed in the chamber 620. The substrate support assembly 200 may support the substrate W. The substrate support assembly 200 may include an electrostatic chuck for attracting the substrate W by using an electrostatic force. Alternatively, the substrate support assembly 200 may support the substrate W in various manners such as mechanical clamping. Hereinafter, the substrate support assembly 200 including the electrostatic chuck will be described.

The substrate support assembly 200 may include an electrostatic chuck, a lower cover 250, and a plate 270. The substrate support assembly 200 may be spaced upwardly apart from the bottom surface of the chamber 620 within the chamber 620.

The electrostatic chuck may include a dielectric plate 220, a body 230, and a focus ring 240a and 240b. The electrostatic chuck may support the substrate W. The dielectric plate 220 may be located at upper end of the electrostatic chuck. The dielectric plate 220 may be provided as a dielectric substance having a disc shape. The substrate W may be placed on an upper surface of the dielectric plate 220. The upper surface of the dielectric plate 220 may have a smaller radius than the substrate W. Therefore, an edge region of the substrate W may be located outside the dielectric plate 220.

The dielectric plate 220 may include a first electrode 223, a heater 225, and a first supply path 221. The first supply path 221 may be provided from the upper surface to the lower surface of the dielectric plate 220. A plurality of first supply paths 221 may be spaced apart from each other and may be provided as a passage through which a heat transfer medium is supplied to the lower surface of the substrate W.

The first electrode 223 may be electrically connected to a first power source 223*a*. The first power source 223*a* may include a DC power source. A switch 223*b* may be installed between the first electrode 223 and the first power source 223*a*. The first electrode 223 may be electrically connected to the first power source 223*a* by turning on/off the switch 223*b*. When the switch 223*b* is turned on, direct current may be applied to the first electrode 223. An electrostatic force may be applied between the first electrode 223 and the substrate W by the current applied to the first electrode 223, and the substrate W may be attracted to the dielectric plate 220 by the electrostatic force.

The heater 225 may be located below the first electrode 223. The heater 225 may be electrically connected to a second power source 225*a*. The heater 225 may generate heat by resisting the current applied from the second power source 225*a*. The generated heat may be transferred to the substrate W through the dielectric plate 220. The substrate W may be maintained at a predetermined temperature by the heat generated from the heater 225. The heater 225 may include a helical coil.

The body 230 may be located below the dielectric plate 220. The lower surface of the dielectric plate 220 and the upper surface of the body 230 may adhere to each other with an adhesive 236. The body 230 may be formed of aluminum. The upper surface of the body 230 may be positioned such that the central region is positioned higher than the edge region. The central region of the upper surface of the body 230 may have an area corresponding to the lower surface of the dielectric plate 220 and may adhere to the lower surface of the dielectric plate 220. The body 230 may be provided therein with a first circulation path 231, a second circulation path 232, and a second supply path 233.

The first circulation path 231 may be provided as a passage through which the heat transfer medium circulates. The first circulation path 231 may be formed in a spiral shape inside the body 230. Alternatively, the first circulation path 231 may be arranged such that the ring-shaped paths having different radius are co-centric. The first circulation paths 231 may communicate with each other. The first circulation paths 231 may be formed at the same height.

The second circulation path 232 may be provided as a passage through which cooling fluid circulates. The second circulation path 232 may be formed in a spiral shape inside the body 230. Alternatively, the second circulation path 232 may be arranged such that such that the ring-shaped paths having different radius are co-centric. The second circulation paths 232 may communicate with each other. The second circulation path 232 may have a larger cross-sectional area than the first circulation path 231. The second circulation paths 232 may be formed at the same height. The second circulation path 232 may be positioned below the first circulation path 231.

The second supply path 233 may extend upward from the first circulation path 231 and be provided on an upper surface of the body 230. The number of second supply paths 233 may correspond to that of the first supply paths 221. The second supply paths 233 may connect the first circulation path 231 to the first supply path 221.

The first circulation path 231 may be connected to a heat transfer medium storage unit 231*a* through a heat transfer medium supply line 231*b*. The heat transfer medium may be stored in the heat transfer medium storage unit 231*a*. The heat transfer medium may include an inert gas. According to an embodiment, the heat transfer medium may include helium (He) gas. The helium gas may be supplied to the first circulation path 231 through the supply line 231*b* and may be supplied to the lower surface of the substrate W sequentially through the second supply path 233 and the first supply path 221. The helium gas may serve as a medium through which the heat transferred from the plasma to the substrate W is transferred to the electrostatic chuck The second circulation path 232 may be connected to a cooling fluid storage unit 232*a* through a cooling fluid supply line 232*c*. The cooling fluid may be stored in the cooling fluid storage unit 232*a*. A cooler 232*b* may be provided in the cooling fluid storage unit 232*a*. The cooler 232*b* may cool the cooling fluid to a predetermined temperature. Alternatively, the cooler 232*b* may be installed on the cooling fluid supply line 232*c*. The cooling fluid supplied to the second circulation path 232 through the cooling fluid supply line 232*c* may circulate along the second circulation path 232 and may cool the body 230. As the body 230 is cooled, the dielectric plate 220 and the substrate W may be cooled together to maintain the substrate W at a predetermined temperature.

The body 230 may include a metal plate. According to an embodiment, the entire body 230 may be provided with a metal plate.

The focus ring 240*a* and 240*b* may be arranged in an edge region of the electrostatic chuck. The focus ring 240*a* and 240*b* may have a ring shape and be arranged along a circumference of the dielectric plate 220. An upper surface of the focus ring 240*a* and 240*b* may be placed such that an outer portion 240*a* is higher than an inner portion 240*b*. The inner upper surface 240*b* of the focus ring 240*a* and 240*b* may be positioned at the same height as the upper surface of the dielectric plate 220. The inner upper surface 240*b* of the focus ring 240*a* and 240*b* may support an edge region of the substrate W located outside the dielectric plate 220. The outer portion 240*a* of the focus ring 240*a* and 240*b* may surround the edge region of the substrate W. The focus ring 240*a* and 240*b* may control an electromagnetic field such that the density of the plasma is uniformly distributed over the entire region of the substrate W. Thus, plasma may be uniformly formed over the entire region of the substrate W so each region of the substrate W may be uniformly etched.

The lower cover 250 may be placed on a lower end of the substrate support assembly 200. The lower cover 250 may be spaced upwardly apart from the bottom surface of the chamber 620. The lower cover 250 may be provided therein with a space of which the upper surface is opened. An outer radius of the lower cover 250 may be provided with a length equal to an outer radius of the body 230. A lift pin module (not shown) for moving the substrate W to be transferred from an external transfer member to the electrostatic chuck may be placed in the inner space 255 of the lower cover 250. The lift pin module (not shown) may be spaced apart from the lower cover 250 by a predetermined distance. The lower surface of the lower cover 250 may be formed of a metal material. The inner space 255 of the lower cover 250 may be provided with air. Since air has a lower dielectric constant than an insulator, the air may serve to reduce the electromagnetic field inside the substrate support assembly 200.

The lower cover 250 may have a connecting member 253. The connecting member 253 may connect the outer surface of the lower cover 250 and the inner wall of the chamber 620. A plurality of connecting members 253 may be provided on the outer surface of the lower cover 250 while being spaced apart from each other by a predetermined interval. The connecting member 253 may support the substrate support assembly 200 in the chamber 620. In addition, the connecting member 253 may be connected to the inner wall of the chamber 620 such that the lower cover 250 is electrically grounded. A first power line 223c connected to the first power source 223a, a second power line 225c connected to the second power source 225a, the heat transfer medium supply line 231b connected to the heat transfer medium storage unit 231a, the cooling fluid supply line 232c connected to the cooling fluid storage unit 232a, and the like may extend to an inside of the lower cover 250 through the inner space 255 of the connecting member 253.

The plate 270 may be placed between the electrostatic chuck and the lower cover 250. The plate 270 may cover the upper surface of the lower cover 250. The plate 270 may be provided to have a sectional area corresponding to the body 230. The plate 270 may include an insulator. According to an embodiment, one or a plurality of plates 270 may be provided. The plate 270 may serve to increase the electrical distance between the body 230 and the lower cover 250.

The showerhead 300 may be placed on an upper portion of the substrate support assembly 200 in the chamber 620. The showerhead 300 may face the substrate support assembly 200.

The showerhead 300 may include a gas distribution plate 310 and a support unit 330. The gas distribution plate 310 may be spaced apart from the upper surface of the chamber 620 to bottom by a predetermined distance. A predetermined space may be formed between the gas distribution plate 310 and the upper surface of the chamber 620. The gas distribution plate 310 may be provided in a plate shape having a constant thickness. A lower surface of the gas distribution plate 310 may be polarized to prevent an arc from being generated by plasma. A cross-section of the gas distribution plate 310 may be provided to have the same shape and sectional area as the substrate support assembly 200. The gas distribution plate 310 may include a plurality of injection holes 311. The injection holes 311 may pass through the upper and lower surfaces of the gas distribution plate 310 in the vertical direction. The gas distribution plate 310 may include a metal material.

The support unit 330 may support a side of the gas distribution plate 310. An upper end of the support unit 330 may be connected to the upper surface of the chamber 620 and a lower end may be connected to the side of the gas distribution plate 310. The support unit 330 may include a non-metallic material.

The gas supply unit 400 may supply a process gas into the chamber 620. The gas supply unit 400 may include a gas supply nozzle 410, a gas supply line 420, and a gas storage unit 430. The gas supply nozzle 410 may be installed at the center of the upper surface of the chamber 620. An injection port may be formed on a lower surface of the gas supply nozzle 410. The injection port may supply the process gas into the chamber 620. The gas supply line 420 may connect the gas supply nozzle 410 and the gas storage unit 430. The gas supply line 420 may supply the process gas stored in the gas storage unit 430 to the gas supply nozzle 410. A valve 421 may be installed to the gas supply line 420. The valve 421 may open and close the gas supply line 420 and may control the flow rate of the process gas supplied through the gas supply line 420.

The baffle unit 500 may be placed between the inner wall of the chamber 620 and the substrate support assembly 200. A baffle 510 may be provided in an annular ring shape. A plurality of through holes 511 may be formed in the baffle 510. The process gas provided into the chamber 620 may be exhausted to the exhaust hole 102 through the through holes 511 of the baffle 510. The flow of the process gas may be controlled corresponding to the shapes of the baffle 510 and the through holes 511.

The power supply unit 600 may supply a high-frequency power to excite the process gas in the chamber 620 into a plasma state. According to an embodiment of the present concept, the power supply unit 600 may be configured in an inductively coupled plasma (ICP) type. In this case, as illustrated in FIG. 1, the power supply unit 600 may include a high-frequency power source 610 configured to supply a high frequency power, and a plasma source 621 and 622 electrically connected to the high-frequency power source 610 to receive the high-frequency power. The plasma source 621 and 622 may include first and second antennas 621 and 622.

The first and second antennas 621 and 622 may be arranged to face the substrate W. For example, the first and second antennas 621 and 622 may be installed on an upper portion of the chamber 620. A diameter of the first antenna 621 may be smaller than that of the second antenna 622, such that the first antenna 621 is placed inside the upper portion of the chamber 620 and the second antenna 622 is placed outside the upper portion of the chamber 620. The first and second antennas 621 and 622 may receive the high-frequency power from the high-frequency power source 610 and may induce a time-varying magnetic field to the chamber 620. Thus, the process gas supplied to the chamber 620 may be excited into plasma.

Hereinafter, a process of treating a substrate using the apparatus for treating a substrate described above will be described.

When the substrate W is placed on the substrate support assembly 200, a DC current may be applied to the first electrode 223 from the first power source 223a. An electrostatic force may be applied between the first electrode 223 and the substrate W by the DC current applied to the first electrode 223, such that the substrate W is attracted to the electrostatic chuck by the electrostatic force.

When the substrate W is attracted to the electrostatic chuck, the process gas may be supplied into the chamber 620 through the gas supply nozzle 410. The process gas may be uniformly injected into the inside of the chamber 620 through the injection hole 311 of the showerhead 300. The high-frequency power generated from the high-frequency power source may be applied to the plasma source, so that an electromagnetic force is generated in the chamber 620. The electromagnetic force may excite the process gas between the substrate support assembly 200 and the showerhead 300 into plasma. The plasma may be provided to the substrate W to process the substrate W. An etching process may be performed by the plasma.

Figure 2:
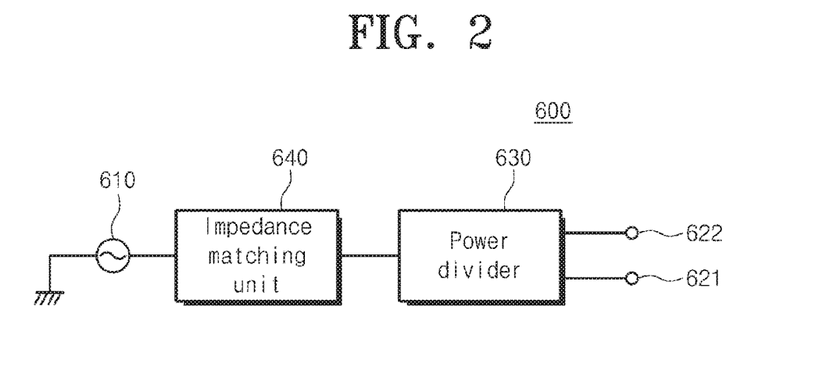
FIG. 2 is an exemplary view illustrating a configuration of a power supply unit used in an apparatus for treating a substrate according to an embodiment of the present concept.

FIG. 2 is an exemplary view illustrating a configuration of a power supply unit 600 used in an apparatus for treating a substrate according to an embodiment of the present concept.

Referring to FIG. 2, the power supply unit 600 may include a high-frequency power source 610, the plurality of plasma sources 621 and 622, a power divider 630, and an impedance matching unit 640.

The high-frequency power source 610 may generate a high-frequency power and supply the generated high-frequency power to the plasma sources 621 and 622 provided in the chamber 620. The high-frequency power source 610 may transmit the high-frequency power through an RF signal. According to an embodiment of the present concept, the high-frequency power source 610 may generate a RF signal in the form of a sinusoidal wave and provide the RF signal to the plasma sources 621 and 622. However, the RF signal is not limited thereto and may have various waveforms such as a sawtooth waveform, a triangle waveform, a pulse waveform, and the like.

The plasma sources 621 and 622 may generate plasma from the gas supplied to the chamber 620 by using the high-frequency power. As illustrated in FIG. 2, the plasma sources 621 and 622 may be plural and may be connected in parallel. According to an embodiment, the plurality of plasma sources may include the first and second antennas 621 and 622. As described above with reference to FIG. 1, at least one of the plasma sources 621 and 622 may be a coil that induces a magnetic field using a high-frequency power. According to an embodiment, the coil may be installed on an upper portion of the chamber 620.

A diameter of the first antenna 621 may be smaller than that of the second antenna 622. As a result, the first antenna 621 may be arranged inside the second antenna 622. As described above, the inductance L1 of the first antenna 621 may be smaller than the inductance L2 of the second antenna 622 due to the difference between the diameters of the first and antennas 621 and 622.

The power divider 630 may include a variable device and may control a ratio of power supplied to the plasma sources corresponding to a variable device value.

The impedance matching unit 640 can match the output impedance and the load impedance with each other at the output terminal of the high frequency power source 610. The power divider 630 may be connected between the impedance matching unit 640 and the plasma sources 621 and 622.

According to an embodiment of the present concept, the impedance matching unit 640 may be provided in one of an L-type, a T-type and a H-type. In an embodiment of the present concept, the first and second antennas 621 and 622 may be provided in one of a planar type, a solenoid type and a stacked type.

The power divider 630 may be connected between the impedance matching unit 640 and the plasma sources 621 and 622 to distribute power to each source (e.g antenna). The power divider 630 may further include a variable device provided to control the power ratio, and a variable device provided to compensate for nonlinearity of power separately supplied.

Hereinafter, embodiments of the power divider 630 will be described with reference to FIGS. 3 to 8.

FIGS. 3 to 8, the power divider 630 may include a plurality of variable devices 631 and 632. In one embodiment, the variable devices 631 and 632 may be variable capacitors. The power divider 630 may be provided as a symmetrical or asymmetrical circuit.

Figure 3:
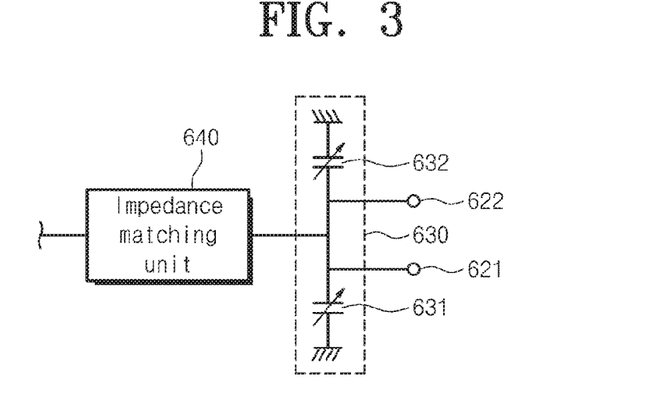
FIGS. 3 to 5 are exemplary views illustrating a case where a power divider is provided in a symmetrical structure in a power supply unit according to an embodiment of the present concept.
Figure 4:
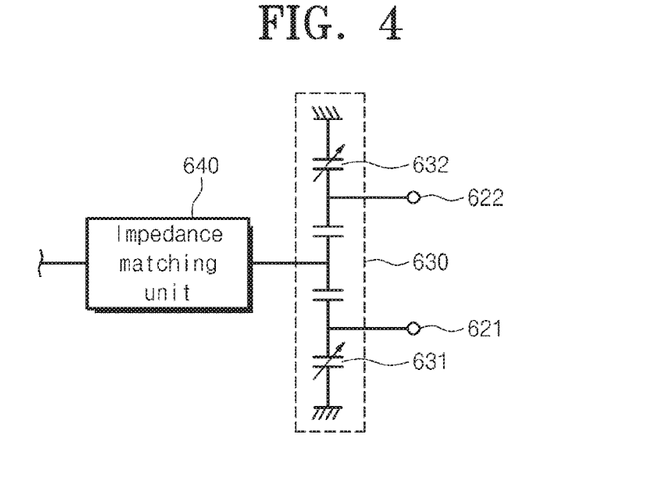
Figure 5:
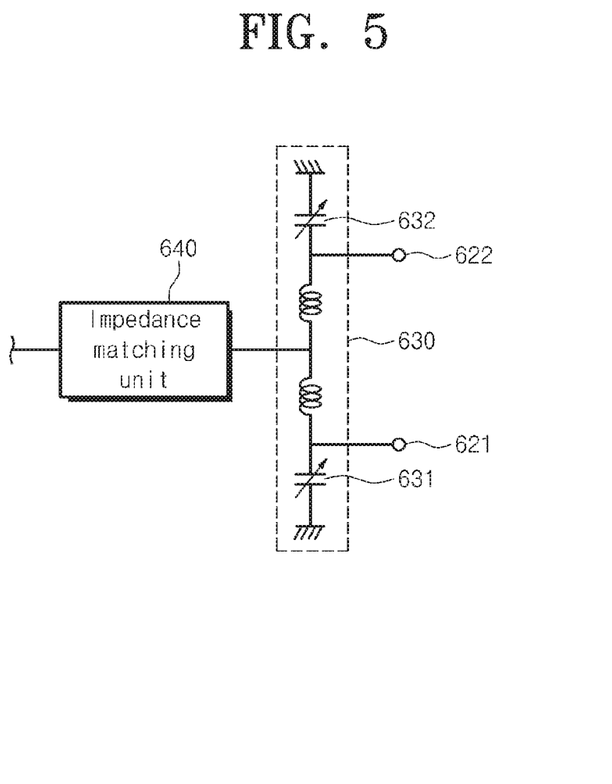

FIGS. 3 to 5 are exemplary views illustrating a case where a power divider is provided in a symmetrical structure in a power supply unit according to an embodiment of the present concept.

According to an embodiment, as illustrated in FIG. 3, the power divider 630 may be provided in a symmetrical structure between the impedance matching unit 640 and the plasma sources 621 and 622. The first variable device 631 and the second variable device 632 of the power divider 630 may be connected in parallel. The first and second antennas 621 and 622 may be connected to the first variable device 631 and the second variable device 632, which are connected in parallel, respectively.

The first variable device 631 may be adjusted to control the power ratio between the first and second antennas 621 and 622. In this case, the second variable device 632 may be adjusted to a suitable value to compensate for the non-linearity of the power variations of the first and second antennas 621 and 622. According to another embodiment, the power divider 630 may further include a pair of reactance devices connected between the first and second variable devices 631 and 632. The pair of reactance devices may also be provided in a symmetrical structure as illustrated FIGS. 4 and 5. Referring to FIGS. 4 and 5, the pair of reactance devices may be capacitors or inductors.

Figure 6:
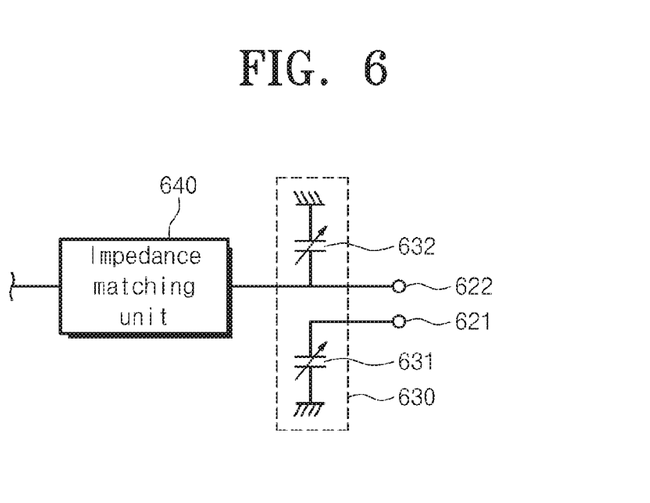
FIGS. 6 to 8 are exemplary views illustrating a case where a power divider is provided in an asymmetrical structure in a power supply unit according to an embodiment of the present concept.
Figure 7:
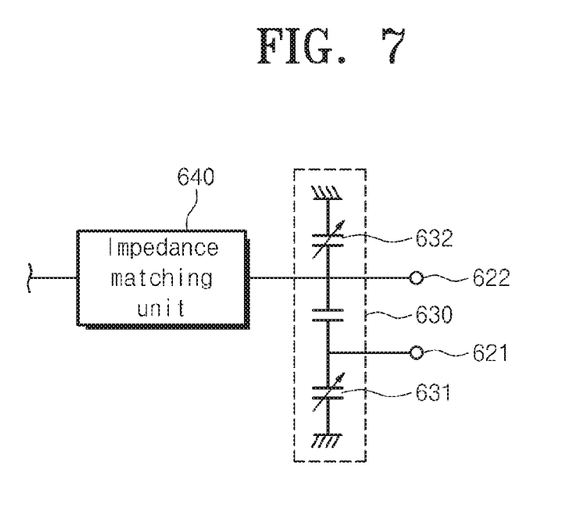
Figure 8:
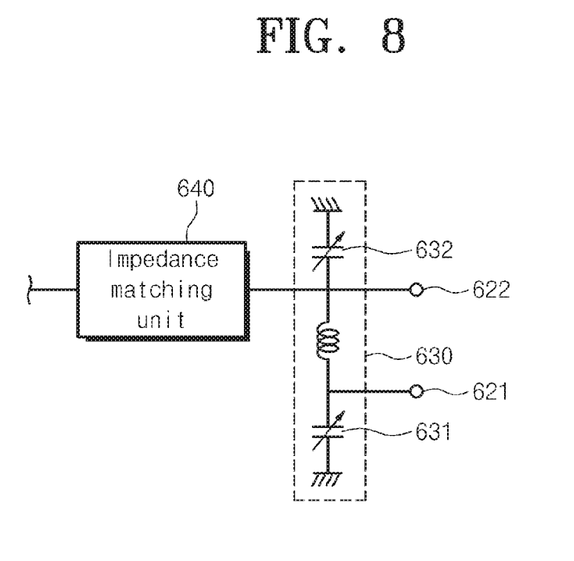

FIGS. 6 to 8 are exemplary views illustrating a case where a power divider is provided in an asymmetrical structure in a power supply unit according to an embodiment of the present concept.

According to an embodiment, as illustrated in FIG. 6, the power divider 630 may be provided in an asymmetrical structure between the impedance matching unit 640 and the plasma sources 621 and 622. The first variable device 631 may be adjusted to control the power ratio between the first and second antennas 621 and 622. For example, when the first variable device 631 of the power divider 630 illustrated in FIG. 6 is adjusted, the mutual inductance between the first and second antennas 621 and 622 is changed so that the power ratio may be adjusted. In this case, the second variable device 632 may be adjusted to a suitable value to compensate for the non-linearity of the power variations of the first and second antennas 621 and 622 due to the adjustment of the first variable device 631.

According to still another embodiment, the power divider 630 may further include a reactance device connected between the first and second variable devices 631 and 632. Referring to FIGS. 7 and 8, the reactance device may be a capacitor or an inductor.

Although an exemplary circuit structure of the power divider 630 has been described with reference to FIGS. 3 to 8, the embodiment of the present concept is not limited thereto and may be implemented with a circuit structure which includes the first variable device 631 configured to control power distribution to the antennas, and the second variable device 632 configured to compensate for nonlinearity of the power change of the antenna by the first variable device 631.

Figure 9:
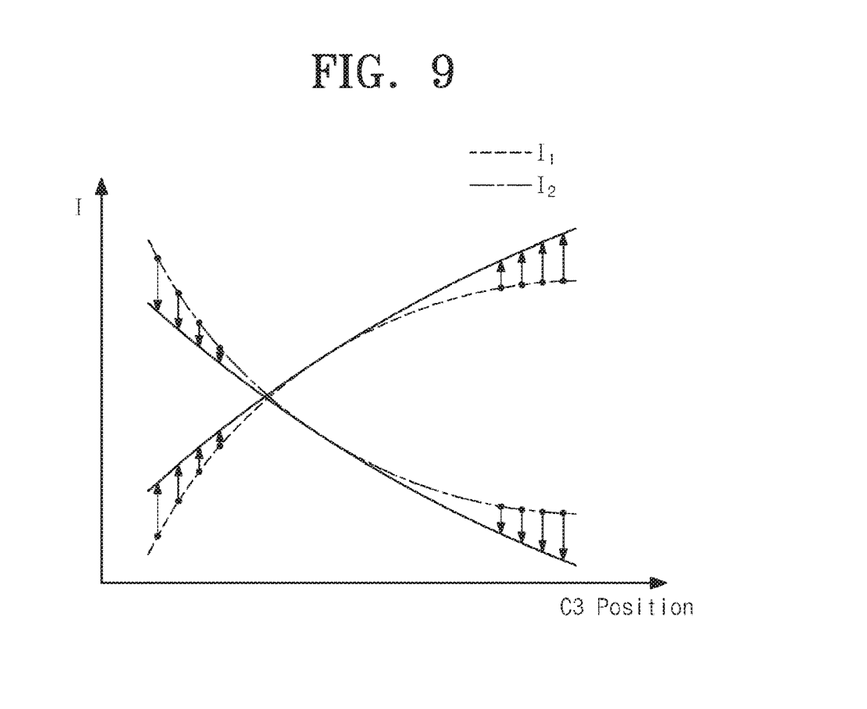
FIG. 9 is a graph illustrating that the nonlinearity of the power ratio caused by adjusting the first variable device (position C3) is compensated in an embodiment of the present concept.

FIG. 9 is a graph illustrating that the nonlinearity of the power ratio caused by adjusting the first variable device (position C3) is compensated in an embodiment of the present concept.

Figure 10:
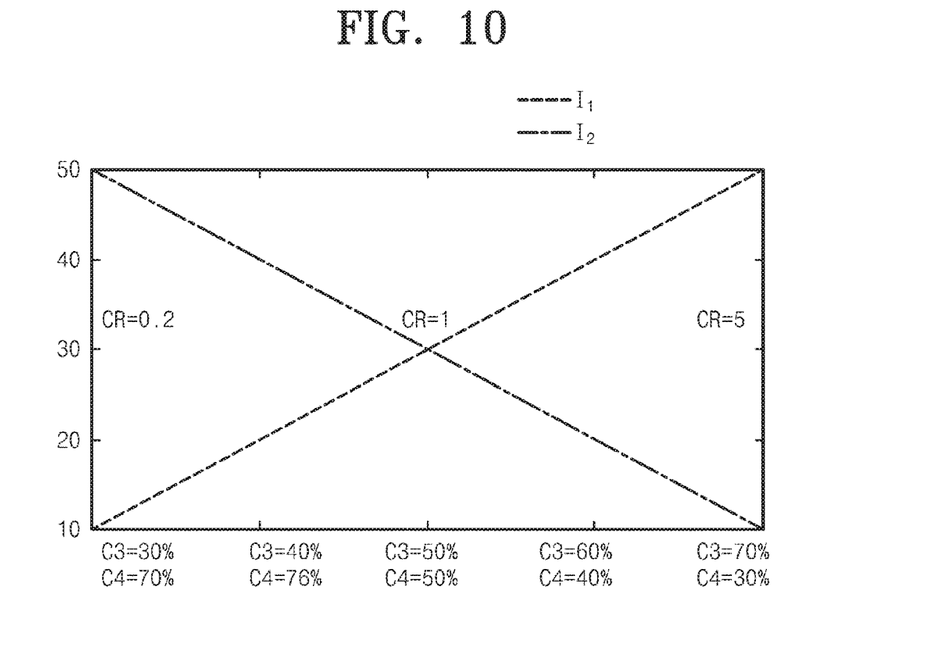
FIG. 10 is a graph illustrating that the linearity of the power ratio caused by adjusting the first and second variable devices (positions C3 and C4) is ensured in an embodiment of the present concept.

Referring to the graph of FIG. 9, it may be understood that when the first variable device (position C3) is adjusted without the second variable device compensating for non-linearity, the changes in the currents $I_1$ and $I_2$ flowing through each antenna exhibit non-linearity. As described above, to solve the problem that it is difficult to control power supplied to a plurality of antennas when linearity is not secured, an embodiment of the present concept compensates for linearity by adding a second variable device. By adding the second variable device and adjusting the second variable device, as shown by a black line in the graph of FIG. 9, the current flowing through each antenna is linear when the second variable device is adjusted. FIG. 10 is a graph illustrating that the linearity of the power ratio caused by adjusting the first and second variable devices (positions C3 and C4) is ensured in an embodiment of the present concept.

If the first variable device is a capacitor C3 and the second variable device is a capacitor C4, as illustrated FIG. 10, when the first and second variable device valves (positions C3 and C4) are changed, the changes of the currents $I_1$ and $I_2$ flowing through each antenna may be linear. The maximum and minimum values obtained by the capacitor C3 and maximum and minimum values obtained by the capacitor C4 may be determined through scanning before the start of the process.

Figure 11:
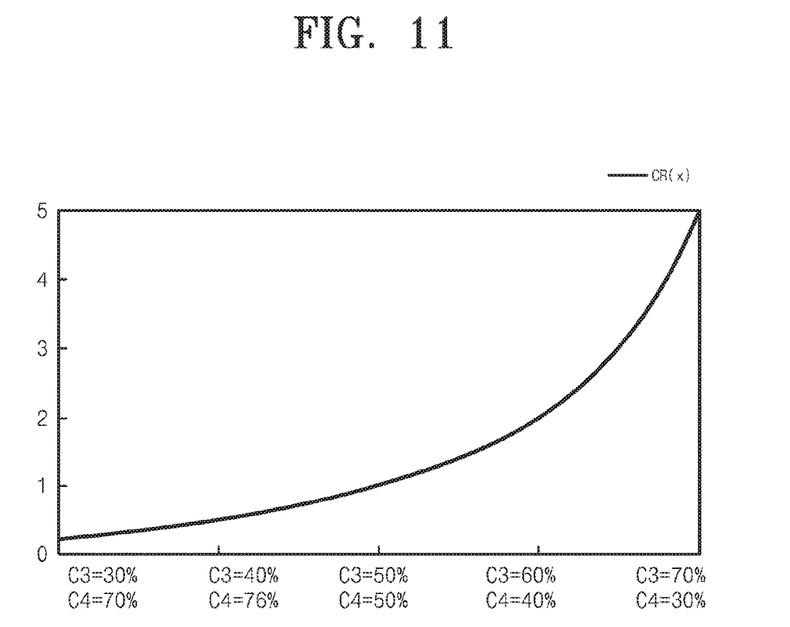
FIG. 11 is a graph illustrating a current ratio (CR) flowing through each antenna by adjusting the first and second variable devices (positions C3 and C4) according to an embodiment of the present concept.

FIG. 11 is a graph illustrating a current ratio (CR) flowing through each antenna by adjusting the first and second variable devices (positions C3 and C4) as illustrated in FIG. 10. Since the currents $I_1$ and $I_2$ flowing through each antenna are linear when the first and second variable devices are adjusted, the current ratio (CR) may be shown as shown in FIG. 11.

Since the above embodiments are presented to help the understanding of the present concept, it should be understood that they do not limit the scope of the present concept and various variations thereto also belong to the scope of the present concept. For example, each component described to be of a single type may be implemented in a distributed manner. Likewise, components described to be distributed may be implemented in a combined manner. Therefore, the technical protective scope of the present concept should be defined by the technical spirit of the following claims and it should be understood that the technical protective scope of the present concept is not limited to the wording of the claims but actually reaches inventions having equivalent technical values.

What is claimed is:

1. An apparatus for supplying power, the apparatus comprising:
    a high-frequency power source configured to provide a high-frequency power;
    a plasma source including first and second antennas, the plasma source configured to generate plasma by using the high-frequency power;
    a power divider connected between the high-frequency power source and the plasma source, the power divider configured to divide the high-frequency power supplied to the first and second antennas; and
    an impedance matching circuit connected between the high-frequency power source and the power divider, the impedance matching circuit configured to perform impedance matching,
    wherein the power divider includes,
        a first variable device configured to control the high-frequency power supplied to the first and second antennas, and
        a second variable device configured to compensate for non-linearity of the high-frequency power supplied to the first and second antennas,
    wherein the power divider further includes a pair of reactance devices between the first and second variable devices, and
    wherein the pair of reactance devices are provided to be symmetrical to each other with respect to the impedance matching circuit.

2. The apparatus of claim 1, wherein the first and second variable devices is variable capacitors.

3. The apparatus of claim 1, wherein the first and second variable devices of the power divider are provided between the impedance matching unit and the plasma source in a symmetrical structure.

4. An apparatus for treating a substrate, the apparatus comprising:
    a chamber having a space for processing the substrate therein;
    a substrate support assembly in the chamber, the substrate support assembly configured to support the substrate;
    a gas supply unit configured to supply a gas into the chamber; and
    a power supply configured to supply a high-frequency power such that the gas in the chamber is excited into a plasma state, the power supply including,
        a high-frequency power source configured to provide the high-frequency power,
        a plasma source including first and second antennas, the plasma source configured to generate plasma by using the high-frequency power,
        a power divider connected between the high-frequency power source and the plasma source, the power divider configured to divide the high-frequency power supplied to the first and second antennas, and
        an impedance matching circuit connected between the high-frequency power source and the power divider, the impedance matching circuit configured to perform impedance matching,
    wherein the power divider includes,
        a first variable device configured to control the high-frequency power supplied to the first and second antennas, and
        a second variable device configured to compensate for non-linearity of the high-frequency power supplied to the first and second antennas,
    wherein the power divider further includes a pair of reactance devices between the first and second variable devices, and
    wherein the pair of reactance devices are provided to be symmetrical to each other with respect to the impedance matching circuit.

5. The apparatus of claim 4, wherein the first and second variable devices is variable capacitors.

6. The apparatus of claim 4, wherein the first and second variable devices of the power divider are provided between the impedance matching unit and the plasma source in a symmetrical structure.

7. An apparatus for supplying power, the apparatus comprising:
    a high-frequency power source configured to provide a high-frequency power;
    a plasma source including first and second antennas configured to generate plasma by using the high-frequency power;
    a power divider connected between the high-frequency power source and the plasma source to divide the high-frequency power supplied to the first and second antennas; and
    an impedance matching circuit between the high-frequency power source and the power divider, the impedance matching circuit configured to perform impedance matching,
    wherein the power divider includes a first variable device and a second variable device between the impedance matching circuit and the plasma source in an asymmetrical structure, and wherein the power divider further includes at least one reactance device and an entirety of the at least one reactance device is between the first and second variable devices.

8. The apparatus of claim 7, wherein
the first variable device is connected to the impedance matching circuit and to the first antenna, and
the second variable device is connected to the second antenna and is not connected to the impedance matching circuit.

9. The apparatus of claim 7, wherein
the impedance matching circuit the first variable device and the second variable device are connected to each other at a node,
the first and second variable device are at opposite sides with respect to the node, and
the at least one reactance device are between the node and one of the first variable device or the second variable device.

10. An apparatus for treating a substrate, the apparatus comprising:
   a chamber having a space for processing the substrate therein;
   a substrate support assembly in the chamber, the substrate support assembly configured to support the substrate;
   a gas supply unit configured to supply a gas into the chamber; and
   a power supply configured to supply a high-frequency power such that the gas in the chamber is excited into a plasma state, the power supply including,
      a high-frequency power source configured to provide the high-frequency power,
      a plasma source including first and second antennas configured to generate plasma by using the high-frequency power,
      a power divider connected between the high-frequency power source and the plasma source to divide the high-frequency power supplied to the first and second antennas, and
      an impedance matching circuit between the high-frequency power source and the power divider, the impedance matching circuit configured to perform impedance matching,
   wherein the power divider includes a first variable device and a second variable device between the impedance matching circuit and the plasma source in an asymmetrical structure, and
   wherein the power divider further includes at least one reactance device and an entirety of the at least one reactance device is between the first and second variable devices.

11. The apparatus of claim 10, wherein
the first variable device is connected to the impedance matching circuit and to the first antenna, and
the second variable device is connected to the second antenna and is not connected to the impedance matching circuit.

12. The apparatus of claim 10, wherein
the impedance matching circuit the first variable device and the second variable device are connected to each other at a node,
the first and second variable device are at opposite sides with respect to the node, and
the at least one reactance device are between the node and one of the first variable device or the second variable device.

* * * * *